United States Patent [19]

Borden et al.

[11] Patent Number: 5,106,827
[45] Date of Patent: Apr. 21, 1992

[54] PLASMA ASSISTED OXIDATION OF PEROVSKITES FOR FORMING HIGH TEMPERATURE SUPERCONDUCTORS USING INDUCTIVELY COUPLED DISCHARGES

[75] Inventors: Michael Borden, Brookfield; Keith Daniell, East Norwalk; Matthew Magida, Monroe; Charles Zarowin, Rowayton, all of Conn.

[73] Assignee: The Perkin Elmer Corporation, Norwalk, Conn.

[21] Appl. No.: 652,231

[22] Filed: Feb. 5, 1991

Related U.S. Application Data

[62] Division of Ser. No. 408,843, Sep. 18, 1989, abandoned.

[51] Int. Cl.$^5$ ............... H01L 39/12; B05D 5/12; C23C 16/56
[52] U.S. Cl. ............... 505/1; 505/742; 427/38; 427/39; 427/62
[58] Field of Search ............... 505/1, 742; 427/38, 427/39, 62, 63

[56] References Cited

U.S. PATENT DOCUMENTS 4,431,898 2/1984 Reinberg et al. ............... 156/646
4,929,598 5/1990 Bagley et al. ............... 427/62

Primary Examiner—Shrive Beck
Assistant Examiner—Margaret Burke
Attorney, Agent, or Firm—Edwin T. Grimes; Thomas P. Murphy

[57] ABSTRACT

A process is described for the formation of high temperature superconducting materials from perovskites by inductively coupled plasma assisted oxidation. An inductively coupled plasma reactor is used to oxidize oxygen deficient perovskites in less time and at lower temperatures than previously possible. High power densities are created within the plasma reactor. This is thought to contribute to the rapid and low temperature phase change during oxidation from tetragonal to orthorhombic crystal structure apparently required for superconductivity at temperatures greater than approximately 77° K. The low temperature and rapid processing time permits the application of conventional lithographic semiconductor manufacturing techniques to be applied to the potentially high temperature superconducting perovskite materials.

5 Claims, 3 Drawing Sheets

5,106,827

PLASMA ASSISTED OXIDATION OF PEROVSKITES FOR FORMING HIGH TEMPERATURE SUPERCONDUCTORS USING INDUCTIVELY COUPLED DISCHARGES

This application is a division of application Ser. No. 07/408,843, filed Sept. 18, 1989, now abandoned.

FIELD OF THE INVENTION

This invention relates generally to the processing of oxygen containing perovskites for obtaining superconducting properties and more particularly to low temperature plasma assisted transformation of such perovskites into high critical temperature superconductors by plasma assistance of the oxidation.

BACKGROUND OF THE INVENTION

It is known that many materials exhibit superconducting properties when they are cooled below "the critical transition temperature". Materials have been discovered recently that exhibit superconducting properties at increasingly higher critical transition temperatures. One family of materials that exhibit this type of superconducting property are the perovskites. Included in this family are compositions in the Ba-La-Cu-O, the La-Sr-Cu-O, and the Y-Ba-Cu-O systems. In particular, compositions in the Y-Ba-Cu-O system have been observed to have a superconducting transition temperature as high as 90° K.

The as made Y-Ba-Cu-O perovskite has a oxygen deficiency and or a tetragonal crystal structure and does not exhibit superconductivity at as high a transition temperature. It is only when this material is further oxidized and changes phase to an orthorhombic crystal structure that the high critical transition temperature (90 K) is exhibited.

In order to reach the required oxidation state for such high temperature superconductivity, they are conventionally annealed by cycling its temperature to above 550° C. These high processing temperatures have frustrated attempts to develop practical applications of these superconducting materials because such temperatures are incompatible for maintaining the minimum feature sizes of the range of semiconductor electronic devices required to implement superconductor devices. This incompatibility at such processing temperatures is caused by interdiffusion or alloying of the various materials used to fabricate both semiconducting and superconducting microelectronic devices. Additionally, the high processing temperatures constrain the application of conventional microlithographic techniques, such as photoresist patterning of such electronic circuits and magnetic structures.

In one attempt to reduce the high temperatures necessary to oxidize the perovskite materials to obtain high temperature superconducting properties plasma oxidation in a cylindrical reactor was tried. This was reported in an article entitled "Plasma Oxidation Of High $T_c$ Superconducting Perovskites" by Bagley et.al., published in Applied Physics Letters on Aug. 24, 1987. Therein, Bagley et.al. discloses the use of a cylindrical reactor having a power density of less than 0.005 W/cm$^3$ with an oxygen pressure of 0.7 Torr operating at a frequency of 13.56 MHz. The heating of the sample was constrained to less than 80° C. but the required exposure to obtain a reasonable degree of superconductivity in the sample was in excess of several hundred hours. The application of direct and capacitively coupled plasma reactors in oxidizing the potentially high temperature superconducting materials has not achieved the desired result of permitting their practical applications. Therefore, there exists a need to advance even further in bringing these potentially tremendously beneficial materials to practical and commercial applications.

SUMMARY OF THE INVENTION

The present invention comprises an apparatus and method for oxidizing materials that are potential high critical temperature superconductors. An inductively coupled plasma reactor, such as the one disclosed in U.S. Pat. No. 4,431,898 entitled "Inductively Coupled Discharge For Plasma Etching And Resist Stripping" issuing on Feb. 14, 1984 to Reinberg et.al., is used to oxidize the perovskite materials at low temperatures. The topologically toroidal oxygen discharge reactor is inductively coupled to a primary winding connected to a radio frequency power supply, typically operating at a frequency below several MHz and having a power suitable to achieve a power density between 0.1 and 10 W/cm$^3$ in the toroidal discharge. The electrical breakdown in the toroidal reactor forms the secondary of the transformer. Oxygen flowing through the reactor between 0.1 and 1000 SCCM and having a pressure between 0.05 and 10 Torr oxidizes the material to achieve the superconducting oxidation state without the need to heat the material to high temperatures.

Therefore, it is an object of the present invention to provide low temperature oxidation of perovskite materials to avoid the diffusion mechanism which limits minimum feature sizes and causes alloying and other performance limiting phenomena.

It is yet another object of the present invention to avoid sputtering within the plasma reactor when requiring high plasma power densities.

It is yet another object of the present invention to shorten the processing times to achieve the oxidation state required for high critical temperature superconductivity in the perovskite materials.

It is yet another object of the present invention to permit the use of conventional microelectronic lithography to fabricate superconducting devices.

These and other objects will become more readily apparent in view of the drawings and detailed description.

DETAILED DESCRIPTION OF THE PREFERRED EMBODIMENTS

Figure 1:
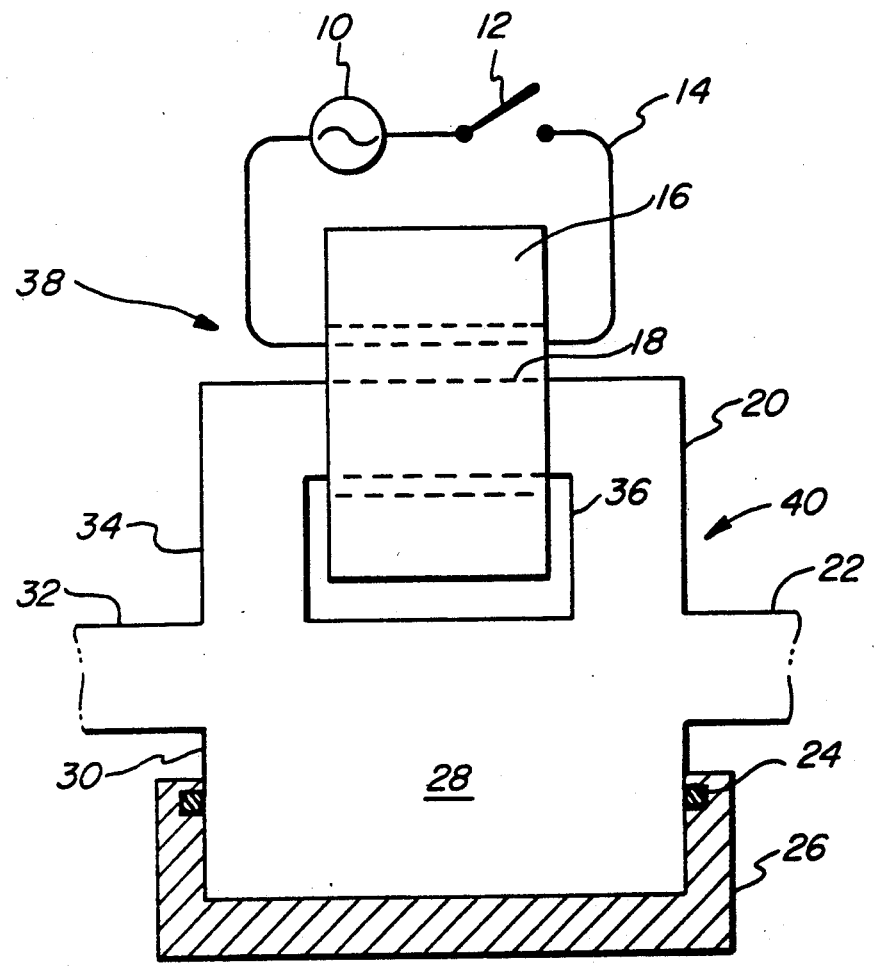
FIG. 1 is a schematic illustrating apparatus used in practicing the invention.

FIG. 1 illustrates an apparatus used to oxidize the potentially superconducting perovskite materials. A similar device, used for a completely different purpose, is disclosed in U.S. Pat. No. 4,431,898 entitled "Inductively Coupled Discharge For Plasma Etching And Resist Stripping" issued to Reinberg et.al. on Feb. 14, 1984 which is herein incorporated by reference. In FIG. 1 an alternating current power source 10 is used to power primary winding 14. The power source 10 can be selectively switched on and off by switch 12. Core 16 inductively couples the primary winding 14 to the plasma chamber 28. Plasma chamber 28 is formed by a closed path toroidally shaped chamber or loop 40 having a top leg 18, a right side leg 20, a bottom leg 30, and a left side leg 34. The legs 18, 20, 30, and 34 form a closed path chamber. This closed path chamber forms the secondary of the transformer 38. Core 16 of the transformer 38 is coupled to the top leg 18 through opening 36 in the plasma chamber 28. Bottom leg 30 is formed on one side by jacket or cover 26. Jacket 26 is sealed to bottom leg 30 by an O-ring 24. Jacket 26 can then be removed from bottom leg 30 so that the processing materials can be placed within plasma chamber 28. An inlet 22 is formed in the right side leg 20 for the introduction of oxygen to be reacted with the perovskite material to be processed. An outlet 32 is formed in left side leg 34 permitting the flow of reactant material therethrough.

In operation, when switch 12 is closed an alternating current will flow through primary winding 14. Loop 40 acts as a secondary coupled to the primary 14 by core 16. Current will then flow within loop 40 generating a plasma within plasma chamber 28. The plasma is generated from the gases within the plasma chamber 28 as introduced by inlet 22.

In the plasma reactor described in FIG. 1 of the present invention the alternating current power supply 10 operates at a frequency below several megahertz (MHz). The power supply also has a power suitable to achieve a power density within the plasma chamber 28 between 0.1 and 10 W/cm$^3$. The reactant gas used for the oxidation of the perovskite materials is oxygen. The flow through the plasma chamber 28 ranges from 1–1000 SCCM (standard cubic centimeters per minute) at a pressure roughly between 0.1 and 10 Torr. The perovskite materials, requiring oxidation to obtain high temperature superconductivity, are placed within the plasma chamber 28 by removing jacket 26 and placing the perovskite material therein. Jacket 26 is then replaced over bottom leg 30. A seal is formed between bottom leg 30 and jacket 26 by O-ring seal 24. Oxygen flow is then established through inlet 22. Current is permitted to flow in primary winding 14 by closing switch 12. This results in an oxygen plasma being created within plasma chamber 28. The plasma then reacts with the perovskite material placed within the plasma chamber 28. Resultingly, the perovskite material is oxidized quickly and at low temperature forming a compound that exhibits high temperature superconductivity.

Figure 2:
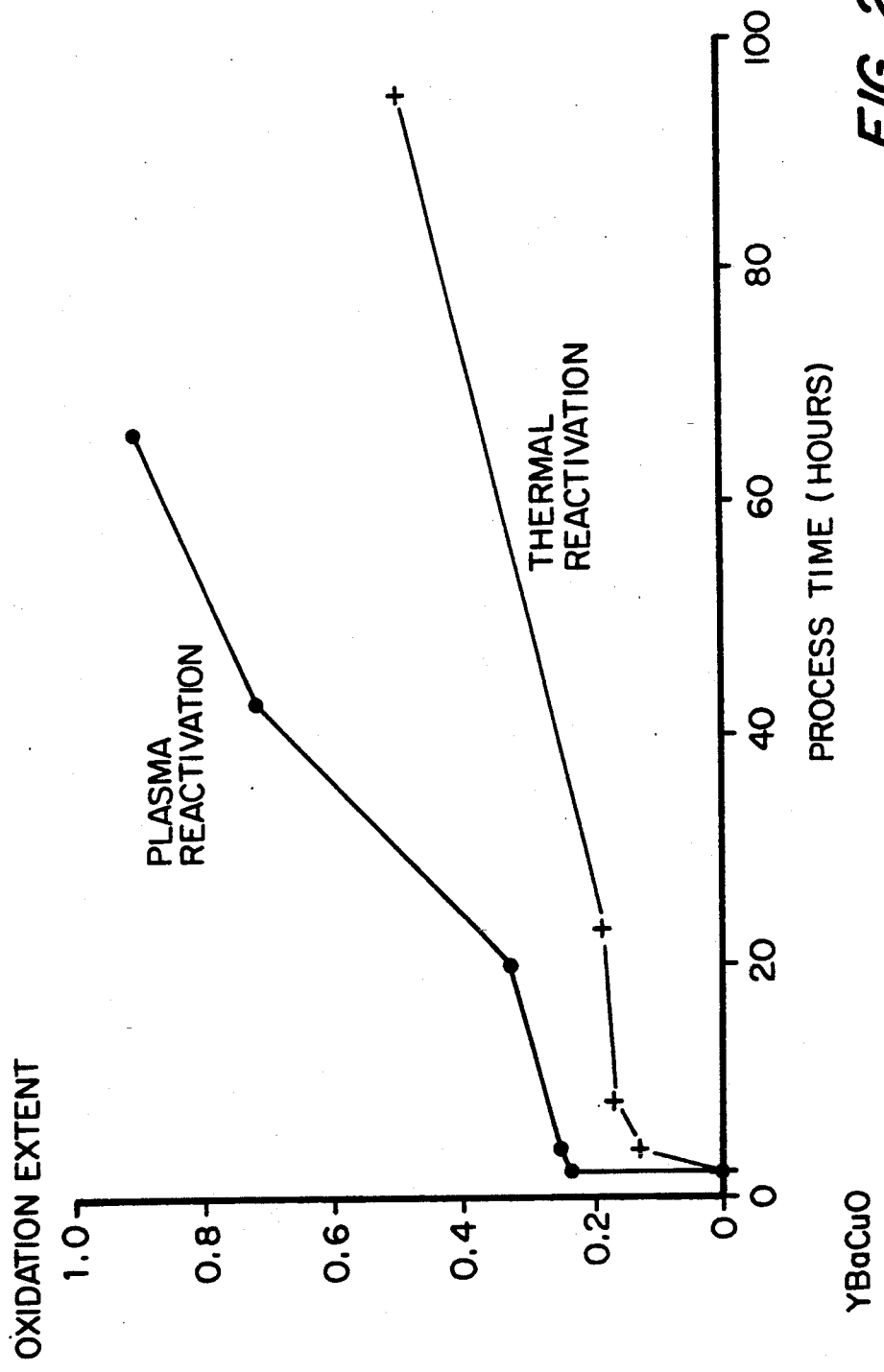
FIG. 2 is a graph comparing oxidation rates.

FIG. 2 illustrates the increased oxidation rate when plasma is used. Data was obtained from the plasma treatment of the potentially superconducting perovskite material YBaCuO at 250° C. The oxygen pressure within the plasma chamber was 0.2 Torr and flowed at rate of 0.1 SCCM. Points along the abscissa represent the processing time in hours. Points along the ordinate represent the extent of oxidation. The lower line represents the oxidation due to the elevated temperature. The upper line represents the oxidation due to the plasma in combination with the elevated temperature. FIG. 2 clearly shows that the plasma reduces the time required to obtain a specific oxidation state. However, some degree of increased oxidation is a result of the heating of the material by the plasma itself. To more clearly indicate the extent plasma assists in the oxidation rate of the perovskite material reference to FIG. 3 is necessary.

Figure 3:
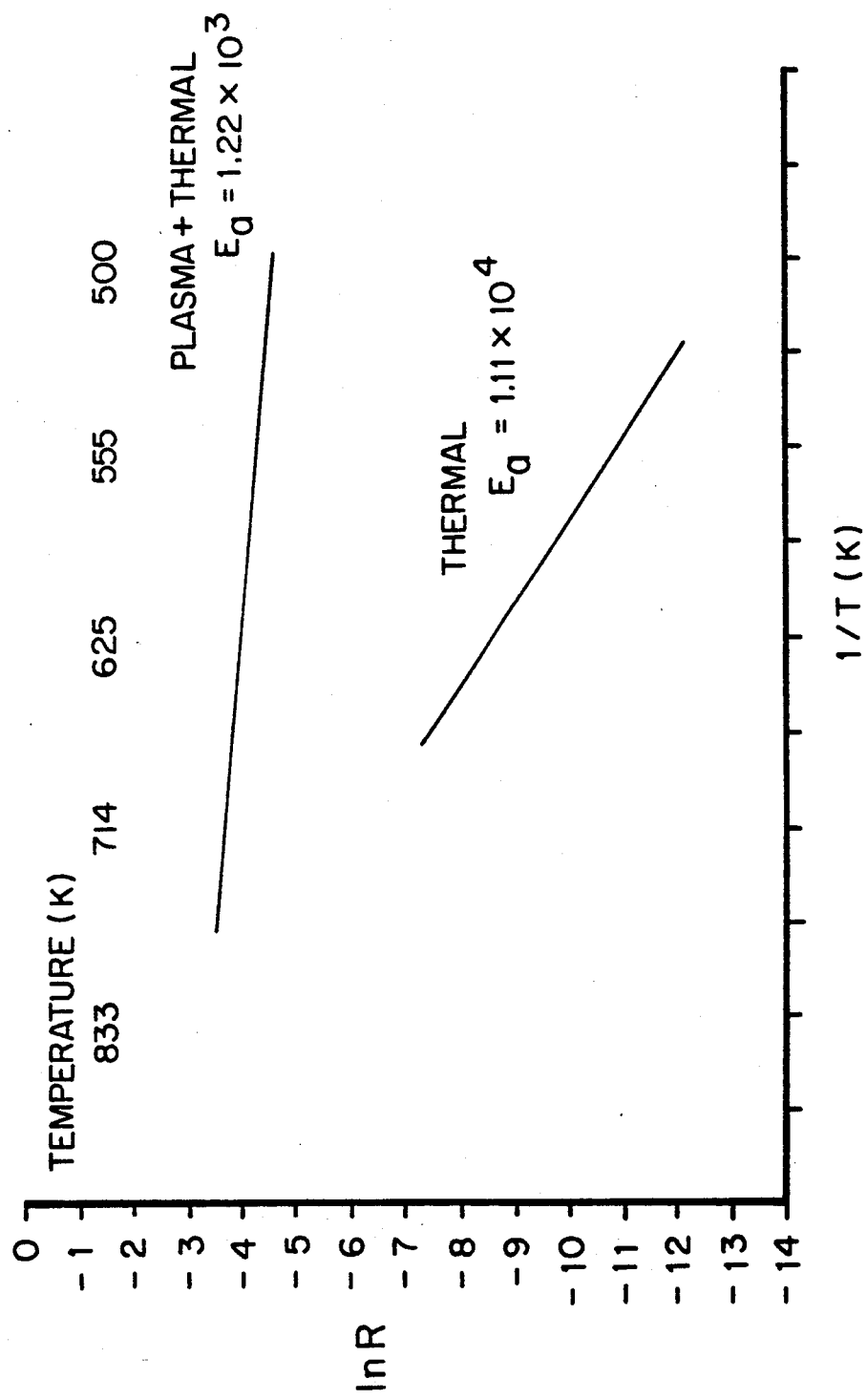
FIG. 3 is a graph comparing apparent activation energy.

FIG. 3 more clearly illustrates the effect of the plasma to improve the transformation of the oxygen deficient perovskite starting material Y-Ba-Cu-O to a high critical temperature superconducting material. FIG. 3 is a so-called Arrhenius plot. The natural logarithm of the oxidation rate, R, ln(R), is plotted on the ordinate and the reciprocal of the temperature in degrees Kelvin, 1/T, is plotted along the abscissa. The effect of the processing pressures (approximately 760 Torr for oxidation without the plasma and approximately 1 Torr with plasma) has been normalized by assuming that the oxidation rate is linear in oxygen pressure. The slope of the straight lines formed by the data points in FIG. 3 represent the activation energies applicable to the purely thermal and plasma processes. Referring to the lower line in FIG. 3, the experimental oxidation without plasma exhibits a relatively large negative slope indicating a large activation energy, $E_a$ for the thermal process. The upper line is for the plasma assisted process and exhibits a smaller negative slope, equivalent to a smaller activation energy in the presence of the plasma. This shows that, at a given temperature of the material, the plasma speeds up the oxidation process independent of the heating of the material.

Prior attempts to use plasma assisted oxidation to transform the perovskites into a high temperature superconducting material have resulted in very slow oxidation rates, requiring as much as several hundred hours for such transformation. However, the present invention using the inductively coupled plasma, makes possible near room temperature oxidation of the perovskite with substantially reduced processing times.

The use of the inductively coupled plasma assisted oxidation permits high power densities without high energy induced sputtering. In contrast, previously used methods cause contamination due to sputtering of the reactor walls and destruction of the superconductivity due to energetic ion bombardment of the perovskite material. Therefore, the present invention permits a high power density discharge, yielding a high density of ions, electrons, and neutral radical species while minimizing the effects of bombardment of the surfaces in the reactor. The high density of the above species increases the rate at which the oxidation occurs while the inductive geometry avoids destructive effects that otherwise accompany such high densities.

Therefore, the present invention provides many advantages not achievable by the prior art. Additionally, while several embodiments have been illustrated and described, it will be obvious to those skilled in the art that various modifications may be made without departing from the spirit and scope of this invention.

What is claimed is:

1. A method for plasma assisted oxidation of a perovskite material comprising the steps of:

placing the perovskite material in a toroidally shaped inductively coupled plasma reactor;
 operating the plasma reactor with an alternating current power supply at a frequency below 5 MHz;
 operating the plasma reactor with a power density between 0.1 and 10 W/cm$^3$;
 providing an oxygen reactant gas during operation of the plasma reactor at a flow rate between 1 and 1,000 standard cubic centimeters per minute;
 maintaining a pressure within the plasma reactor during operation between 0.1 and 10 Torr;
 maintaining the perovskite material at substantially room temperature; and maintaining operation of the plasma reactor until the perovskite material achieves an oxidation state causing a phase change from tetragonal to orthorhombic symmetry resulting in high temperature superconductivity with less thermal energy and more quickly than other methods of plasma assistance.

2. A method as in claim 1 wherein the starting perovskite material is an oxygen deficient perovskite material.

3. A method as in claim 1 wherein the starting perovskite material is selected from the Y-Ba-Cu-O system.

4. A method as in claim 1 wherein the starting perovskite material is selected from the Ba-La-Cu-O system.

5. A method as in claim 1 wherein the starting perovskite material is selected from the La-Sr-Cu-O system.

* * * * *